(12) United States Patent
Wang et al.

(10) Patent No.: US 10,811,548 B2
(45) Date of Patent: Oct. 20, 2020

(54) INTEGRATED CIRCUIT HAVING OPTICAL STRUCTURE

(71) Applicant: Guangzhou Tyrafos Semiconductor Technologies Co., LTD, Guangzhou (CN)

(72) Inventors: Jia-Shyang Wang, Miaoli County (TW); Ping-Hung Yin, Taipei (TW); Hsu-Wen Fu, Kaohsiung (TW); Chun-Yu Lee, New Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/368,881

(22) Filed: Mar. 29, 2019

(65) Prior Publication Data

US 2019/0305147 A1   Oct. 3, 2019

Related U.S. Application Data

(60) Provisional application No. 62/651,205, filed on Apr. 1, 2018.

(30) Foreign Application Priority Data

Aug. 21, 2018 (TW) .............................. 107129123 A

(51) Int. Cl.
*H01L 31/0232* (2014.01)
*H01L 31/02* (2006.01)

(52) U.S. Cl.
CPC .. *H01L 31/02327* (2013.01); *H01L 31/02005* (2013.01)

(58) Field of Classification Search
CPC combination set(s) only.
See application file for complete search history.

(56) References Cited

U.S. PATENT DOCUMENTS

| 2015/0021634 A1* | 1/2015 | Ishihara | ............ G02F 1/133611 |
| | | | 257/88 |
| 2018/0270403 A1* | 9/2018 | Chung | ................. H04N 5/2253 |

(Continued)

FOREIGN PATENT DOCUMENTS

| CN | 105844212 | 8/2016 |
| CN | 107580709 | 1/2018 |

(Continued)

OTHER PUBLICATIONS

"Office Action of Taiwan Counterpart Application", dated Jun. 17, 2019, pp. 1-5.

*Primary Examiner* — Nduka E Ojeh
(74) *Attorney, Agent, or Firm* — JCIPRNET

(57) ABSTRACT

An integrated circuit having an optical structure is provided. The integrated circuit includes a semiconductor substrate and a plurality of light guiding pattern layers. The light guiding pattern layers are located above the semiconductor substrate, and each of the light guiding pattern layers has a plurality of openings and a plurality of side wall portions corresponding to the openings. Each of the side wall portions surrounds the corresponding opening. A projection of one of the openings of one of the light guiding pattern layers on the semiconductor substrate at least partially overlaps a projection of one of the openings of the adjacent light guiding pattern layer on the semiconductor substrate, so as to form at least one light via hole and allow external light to be transferred to the semiconductor substrate through the light guiding pattern layers.

8 Claims, 4 Drawing Sheets

(56) References Cited

U.S. PATENT DOCUMENTS

2018/0275473 A1* 9/2018 Lo .................... H01L 27/124
2020/0104562 A1* 4/2020 Sung .................. H01L 27/323

FOREIGN PATENT DOCUMENTS

CN        107844767      3/2018
WO    WO-2018113103 A1 * 6/2018 ............... G06K 9/00

* cited by examiner

INTEGRATED CIRCUIT HAVING OPTICAL STRUCTURE

CROSS-REFERENCE TO RELATED APPLICATION

This application claims the priority benefits of U.S. provisional application Ser. No. 62/651,205, filed on Apr. 1, 2018, and Taiwan application serial no. 107129123, filed on Aug. 21, 2018. The entirety of each of the above-mentioned patent applications is hereby incorporated by reference herein and made a part of this specification.

TECHNICAL FIELD

The disclosure relates to an integrated circuit, and more particularly, to an integrated circuit having an optical structure.

DESCRIPTION OF RELATED ART

In the existing image sensor manufacturing process, optical structures are formed on semiconductor chips, e.g., micro-lenses, color filters, micro-electromechanical systems (MEMS) components, etc. Generally, such an optical structure is formed by performing an additional manufacturing process after the manufacturing process of an integrated circuit is implemented. In order to obtain an optical structure of a collimator, a conventional method is to place an MEMS collimator manufactured by performing an MEMS etching process. However, the manufacture of such an optical structure by performing the MEMS etching process is complicated and costly, which is disadvantageous for mass production. Besides, the image sensors formed in this manner have a large thickness and volume.

SUMMARY

The disclosure provides an integrated circuit having an optical structure, and the optical structure can be formed by a metal interconnect of a semiconductor substrate.

In an embodiment of the disclosure, an integrated circuit having an optical structure includes a semiconductor substrate and a plurality of light guiding pattern layers. The light guiding pattern layers are located above the semiconductor substrate, wherein each of the light guiding pattern layers respectively has a plurality of openings and a plurality of side wall portions corresponding to the openings, each of the side wall portions surrounds the corresponding opening, and a projection of one of the openings of one of the light guiding pattern layers on the semiconductor substrate at least partially overlaps a projection of one of the openings of the adjacent light guiding pattern layers on the semiconductor substrate, so as to form at least one light via hole and allow external light to be transferred to the semiconductor substrate through the light guiding pattern layers.

According to an embodiment of the disclosure, the light guiding pattern layers include a first light guiding pattern layer, a second light guiding pattern layer, and a third light guiding pattern layer. The first light guiding pattern layer is located above the semiconductor substrate and has a plurality of first openings. The second light guiding pattern layer is located above the first light guiding pattern layer and has a plurality of second openings, wherein the first openings respectively correspond to the second openings, and a projection of each of the first openings on the semiconductor substrate and a projection of the corresponding second opening on the semiconductor substrate are overlapped on a first region. The third light guiding pattern layer is located above the second light guiding pattern layer and has a plurality of third openings. Here, the second openings respectively correspond to the third openings, and a projection of each of the second openings on the semiconductor substrate and a projection of the third opening on the semiconductor substrate are overlapped on a second region.

According to an embodiment of the disclosure, the first region and the second region are at least partially overlapped.

According to an embodiment of the disclosure, the first region and the second region are completely overlapped, and one of the first openings, second openings, and third openings which are corresponding to each other forms the at least one light via hole.

According to an embodiment of the disclosure, an extension direction of the at least one light via hole is perpendicular to the semiconductor substrate.

According to an embodiment of the disclosure, the projection of one of the first openings on the semiconductor substrate, the first region, the projection of the corresponding second opening on the semiconductor substrate, the second region, and the projection of the corresponding third opening are sequentially arranged along an arrangement direction, and the arrangement direction is parallel to a surface of the semiconductor substrate.

According to an embodiment of the disclosure, one of the plurality of first openings, second openings, and third openings which are corresponding to each other forms the at least one light via hole, an included angle is between an extension direction of the at least one light via hole and the semiconductor substrate, and the included angle is less than 90 degrees.

According to an embodiment of the disclosure, the light guiding pattern layers are formed by a metal interconnect of the integrated circuit.

According to an embodiment of the disclosure, a material of the light guiding pattern layers is metal.

According to an embodiment of the disclosure, the integrated circuit having the optical further includes a plurality of dielectric layers, each of which is located between two of the light guiding pattern layers.

As described above, in the integrated circuit having the optical structure provided in one or more embodiments of the disclosure, the manufacturing process of the optical structure and the current manufacturing process of semiconductor devices can be integrated, and the light guiding pattern layers can be formed by the metal interconnect of the semiconductor substrate, so as to directly form the optical structure on the semiconductor chip. As such, the manufacturing method of the resultant integrated circuit is simple, cost-effective, and the resultant integrated circuit has the reduced thickness.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
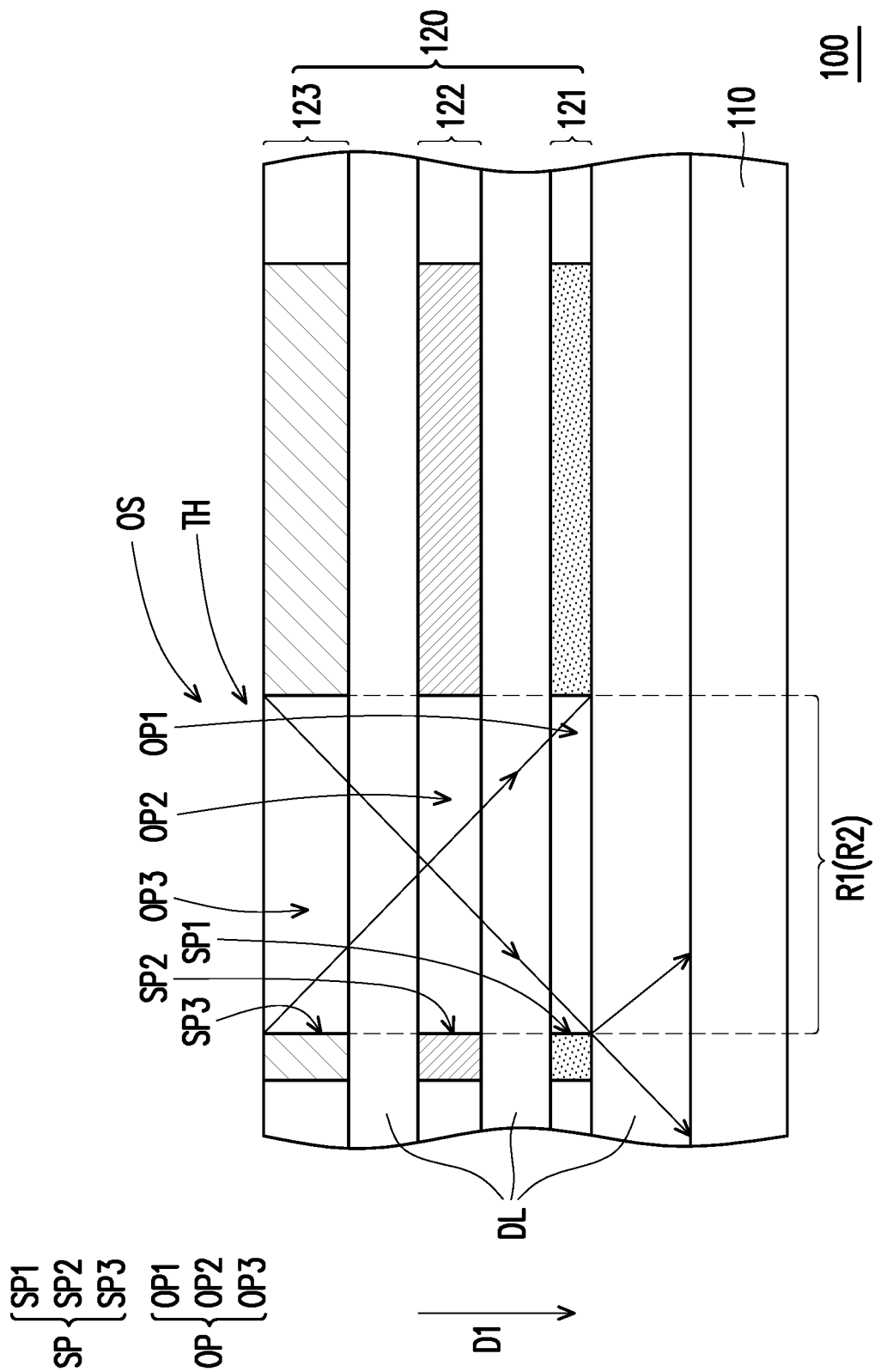
FIG. 1A is a schematic cross-sectional view illustrating an integrated circuit having an optical structure according to an embodiment of the disclosure.
Figure 1B:
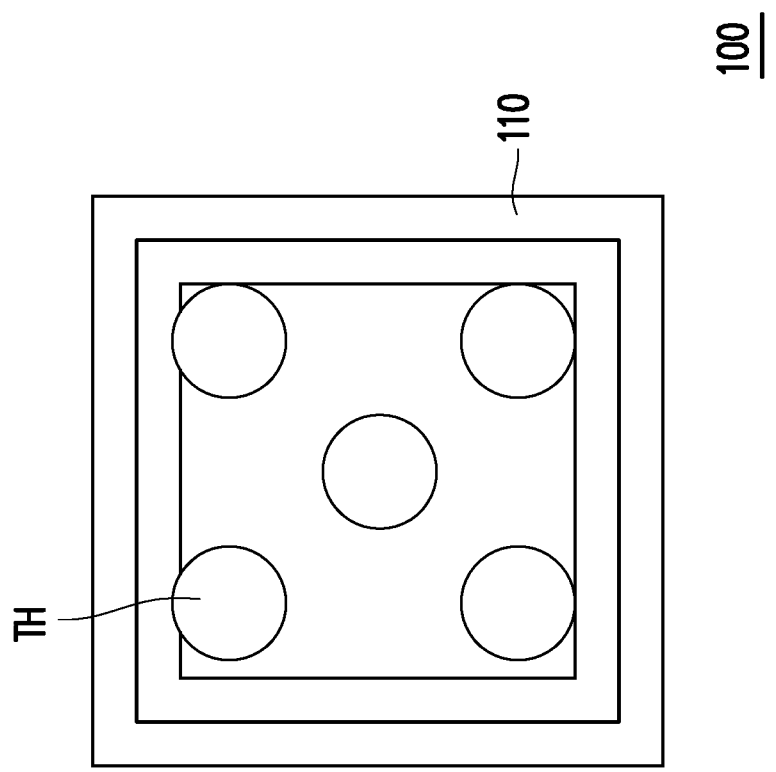
FIG. 1B is a schematic top view illustrating an integrated circuit having an optical structure according to an embodiment of the disclosure.

FIG. 1A is a schematic cross-sectional view illustrating an integrated circuit having an optical structure according to an embodiment of the disclosure. FIG. 1B is a schematic top view illustrating an integrated circuit having an optical structure according to an embodiment of the disclosure. With reference to FIG. 1A and FIG. 1B, in the present embodiment, an integrated circuit 100 having an optical structure OS includes a semiconductor substrate 110 and a plurality of light guiding pattern layers 120. For instance, in the present embodiment, the semiconductor substrate 110 is equipped with a semiconductor device acting as a sensor device (not shown), which should however not be construed as a limitation in the disclosure. From another perspective, in the present embodiment, the light guiding pattern layers 120 are formed by a metal interconnect of the integrated circuit 100. That is, in the present embodiment, a material of the light guiding pattern layers 120 is metal (e.g., copper or aluminum), which should however not be construed as a limitation in the disclosure. In another embodiment, the light guiding pattern layers 120 may also be formed by other structures (e.g., black photoresist) in the integrated circuit 100, which should however not be construed as a limitation in the disclosure.

Particularly, as shown in FIG. 1A, in the present embodiment, the light guiding pattern layers 120 are located above the semiconductor substrate 110, and each of the light guiding pattern layers 120 has a plurality of openings OP and a plurality of side wall portions SP corresponding to the openings OP. For instance, each of the side wall portions SP surrounds the corresponding opening OP, i.e., a side wall portion SP1, a side wall portion SP2, and a side wall portion SP3 respectively surround the first opening OP1, the second opening OP2, and the third opening OP3. Besides, a projection of one of the openings of one of the light guiding pattern layers (e.g., a second light guiding pattern layer 122) on the semiconductor substrate 110 and a projection of one of the openings of the adjacent light guiding pattern layer (e.g., a first light guiding pattern layer 121 or a third light guiding pattern layer 123) on the semiconductor substrate 110 is at least partially overlapped, so as to form at least one light via hole TH. Thereby, external light can be transferred to sensor devices of the semiconductor substrate 110 through the light guiding pattern layers 120.

For instance, as shown in FIG. 1A, in the present embodiment, the integrated circuit 100 further includes a plurality of dielectric layers DL, and the light guiding pattern layers 120 includes a first light guiding pattern layer 121, a second light guiding pattern layer 122, and a third light guiding pattern layer 123. As shown in FIG. 1A, in the present embodiment, the first light guiding pattern layer 121 is located above the semiconductor substrate 110, the second light guiding pattern layer 122 is located above the first light guiding pattern layer 121, the third light guiding pattern layer 123 is located above the second light guiding pattern layer 122, and each of the dielectric layers DL is respectively located between two of the light guiding pattern layers 120.

As shown in FIG. 1A, in the present embodiment, the first light guiding pattern layer 121 has a plurality of first openings OP1, the second light guiding pattern layer 122 has a plurality of second openings OP2, and the third light guiding pattern layer 123 has a plurality of third openings OP3. The first openings OP1, the second openings OP2, and the third openings OP3 respectively correspond to one another. Besides, the projection of each of the first openings OP1 on the semiconductor substrate 110 and the projection of the corresponding second opening OP2 on the semiconductor substrate 110 are overlapped on the first region R1, and the projection of each of the second openings OP2 on the semiconductor substrate 110 and the projection of the corresponding third opening OP3 on the semiconductor substrate 110 are overlapped on the second region R2, so as to form at least one light via hole TH. That is, as shown in FIG. 1A, in the present embodiment, the first region R1 and the second region R2 are at least partially overlapped, so as to form the at least one light via hole TH.

To be more specific, as shown in FIG. 1A, the first opening OP1, the second opening OP2, and the third opening OP3 are completely overlapped; hence, in the present embodiment, the first region R1 and the second region R2 are completely overlapped. Accordingly, the corresponding first, second, and third openings OP1, OP2, and OP3 can form the at least one light via hole TH. As such, in the present embodiment, an extension direction D1 of the at least one light via hole TH is perpendicular to the semiconductor substrate 110; in other words, according to the present embodiment, the at least one light via hole TH is a through hole. The external light can thereby be transferred to the semiconductor substrate 110 through the light guiding pattern layers 120, so as to allow sensor devices (not shown) on the semiconductor substrate 110 to read and identify image information in the external light.

According to the present embodiment, the first, second, and third openings OP1, OP2, and OP3 are completely overlapped, for instance, which should however not be construed as a limitation in the disclosure. In another embodiment, the first, second, and third openings OP1, OP2, and OP3 may also be partially overlapped, so as to improve an aspect ratio of the at least one light via hole TH. Further explanation will be provided hereinafter with reference to FIG. 2.

Figure 2:
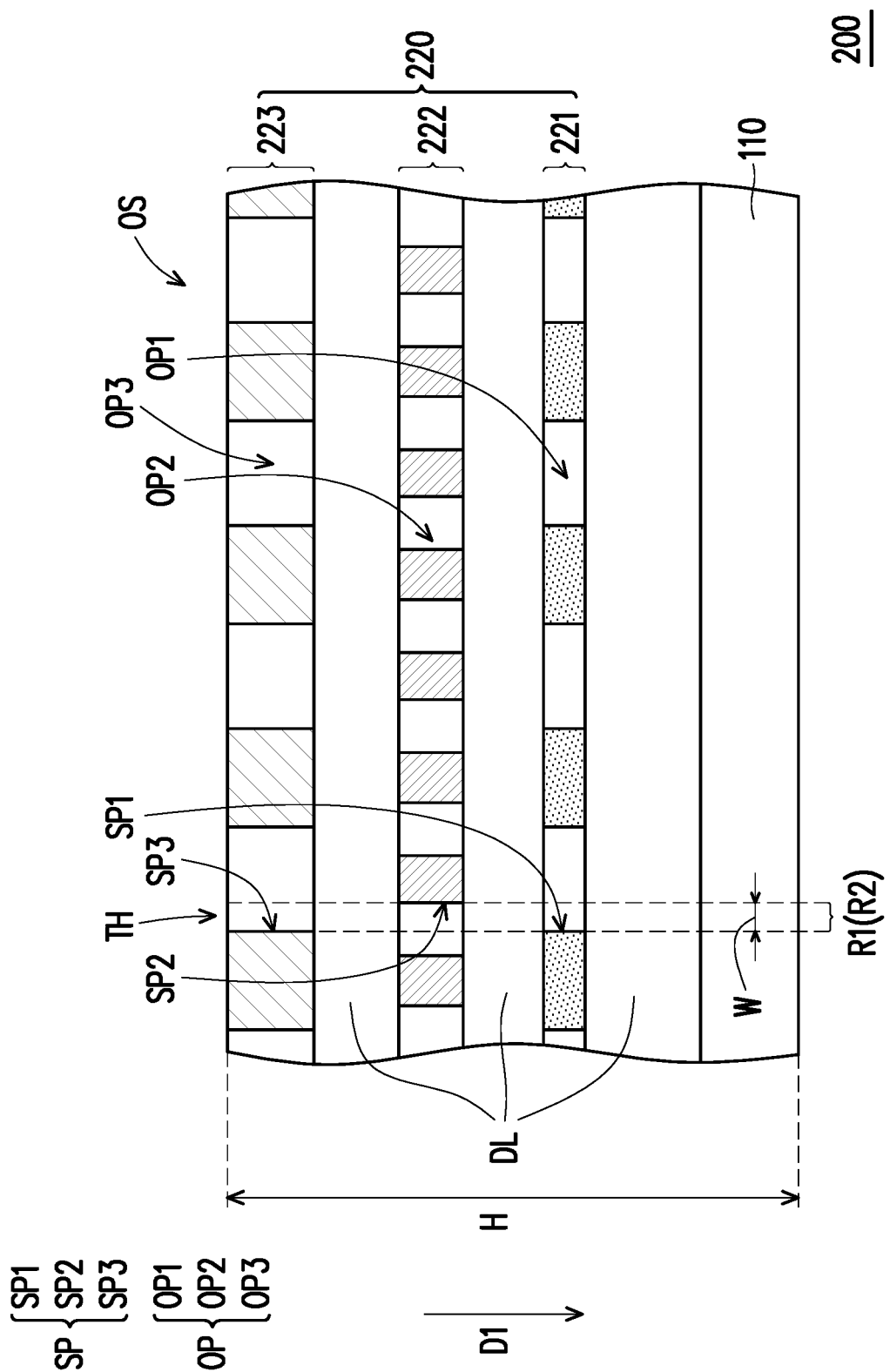
FIG. 2 is a schematic cross-sectional view of another integrated circuit having an optical structure according to an embodiment of the disclosure.

FIG. 2 is a schematic cross-sectional view of another integrated circuit having an optical structure according to an embodiment of the disclosure. With reference to FIG. 2, an integrated circuit 200 provided in the present embodiment is similar to the integrated circuit 100 depicted in FIG. 1A, and the differences therebetween are described below. With reference to FIG. 2, in the present embodiment, the openings OP of different light guiding pattern layers 220 (i.e., the corresponding first, second, and third openings OP1, OP2 and OP3) are not completely overlapped. For instance, in the present embodiment, the second opening OP2 of the second light guiding pattern layer 222 may be misaligned with the first opening OP1 of the first light guiding pattern layer 221 and the third opening OP3 of the third light guiding pattern layer 223, and the first opening OP1 of the first light guiding pattern layer 221 and the third opening OP3 of the third light guiding pattern layer 223 are still completely overlapped. Thereby, the first region R1 and the second region R2 are completely overlapped. Therefore, as shown in FIG. 2, in the present embodiment, at least one light via hole TH can also be formed within a range where the corresponding first, second, and third openings OP1, OP2, and OP3 are overlapped, and the extension direction D1 of the at least one light via hole TH is still perpendicular to the semiconductor substrate 110.

As such, the external light can also be transferred to the semiconductor substrate 110 through the light guiding pattern layers 220, so as to allow the sensor devices on the semiconductor substrate 110 to read and identify the image information in the external light. However, as shown in FIG. 2, in the present embodiment, the first, second, and third openings OP1, OP2, and OP3 are partially overlapped, and thus a transmission path of the external light is limited. For instance, the light moving toward the lower-right side is limited by the side wall portion SP2 of the second light guiding pattern layer 222, the light moving toward the lower-left side is limited by the side wall portion SP3 of the third light guiding pattern layer 223 and the side wall portion SP1 of the first light guiding pattern layer 221. As such, an apparent increase in the aspect ratio of the light via hole TH can be observed, and the aspect ratio is thus improved.

Generally, in some embodiments, the aspect ratio (height H/width W) of the light via hole TH is approximately 1-2. According to the present embodiment, the aspect ratio (height H/width W) of the light via hole TH can be greater than 10. As such, the angle at which the external light is incident to the semiconductor substrate 110 can be collimated to a greater extent, so as to obtain clear image information. For instance, as shown in FIG. 1A, if the aspect ratio of the light via hole TH is relatively small, the external light is more likely to be transferred to the adjacent pixel region, and thus the collimation of the optical structure OS of the integrated circuit 100 is not as expected. However, in the embodiment shown in FIG. 2, the aspect ratio of the light via hole TH is apparently increased; therefore, the collimation of the optical structure OS of the integrated circuit 200 can be effectively improved, so as to obtain clearer image information. Note that the numeral range provided herein is merely exemplary and is not intended to limit the scope given in the disclosure.

In the previous embodiments, the light via hole TH is, for instance, a through hole, which should not be construed as a limitation in the disclosure. In another embodiment, the light via hole TH may have a profile of an inclined via hole. Further explanation will be provided hereinafter with reference to FIG. 3.

Figure 3:
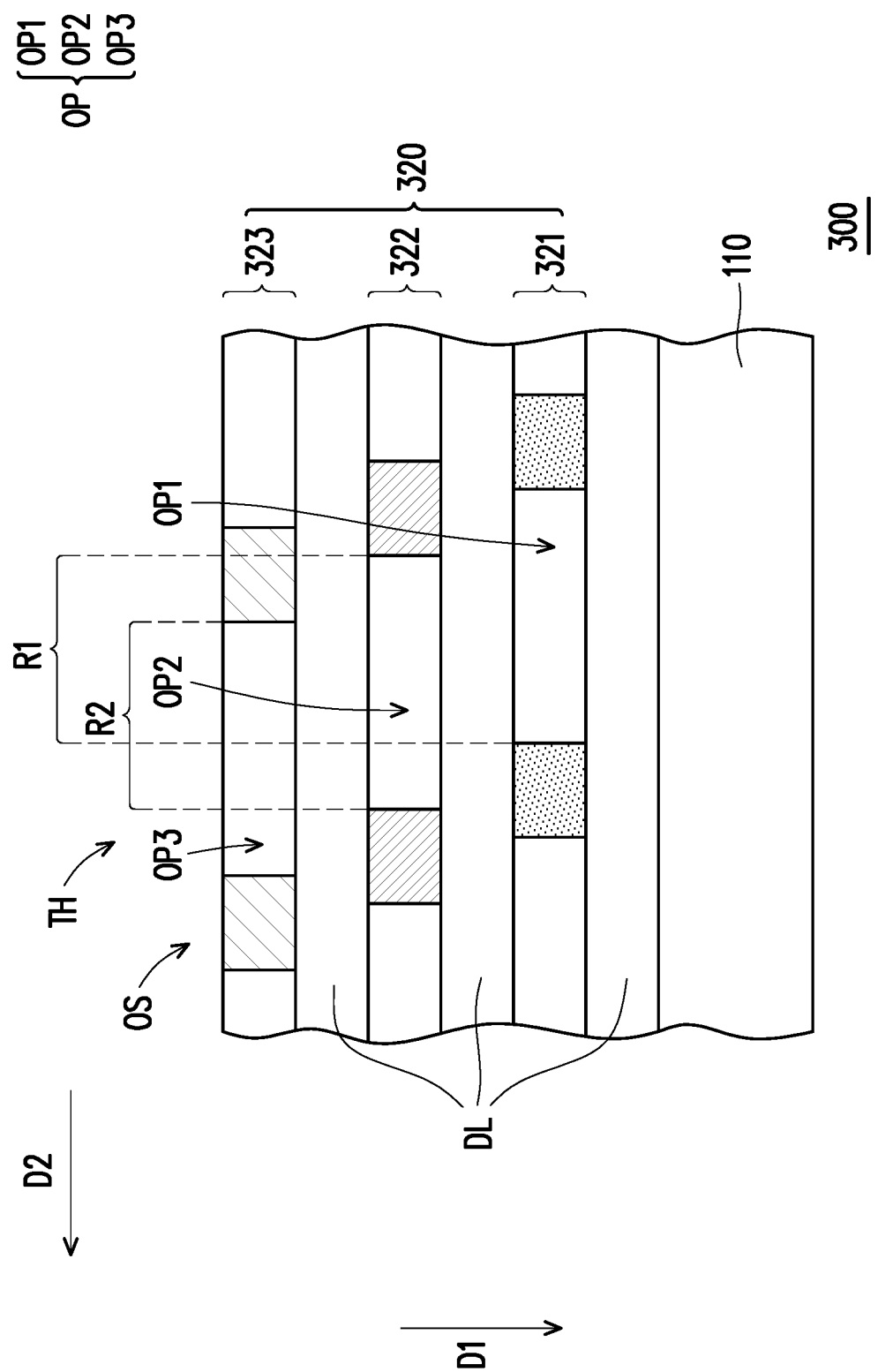
FIG. 3 is a schematic cross-sectional view of another integrated circuit having an optical structure according to an embodiment of the disclosure.

FIG. 3 is a schematic cross-sectional view of another integrated circuit having an optical structure according to an embodiment of the disclosure. With reference to FIG. 3, an integrated circuit 300 provided in the present embodiment is similar to the integrated circuit 200 depicted in FIG. 2, and the differences therebetween are described below. With reference to FIG. 3, in the present embodiment, the projection of each of the first openings OP1 on the semiconductor substrate 110, the first region R1, the projection of the corresponding second opening OP2 on the semiconductor substrate 110, the second region R2, and the projection of the corresponding third opening OP3 on the semiconductor substrate 110 are sequentially arranged along an arrangement direction D2, and the arrangement direction D2 is parallel to a surface of the semiconductor substrate 110.

Therefore, in the present embodiment, each first opening OP1 of the first light guiding pattern layer 321, each second opening OP2 of the second light guiding pattern layer 322, and each third opening OP3 of the third light guiding pattern layer 323 are sequentially arranged along the arrangement direction D2 and are misaligned, and thus the first region R1 is not completely overlapped with the second region R2. As such, an included angle may exist between the extension direction D1 of the at least one light via hole TH constituted by the corresponding first, second, and third openings OP1, OP2, and OP3 and the semiconductor substrate 110, and the included angle is less than 90 degrees. The light via hole TH can thereby have the profile of the inclined via hole and can thus be applied in case of a requirement for a specific light-collecting angle.

In the previous embodiments, the integrated circuits 200 and 300 each having the optical structure OS as shown in FIG. 2 and FIG. 3 and described in the previous embodiments are similar to the integrated circuit 100 having the optical structure OS, the integrated circuits 200 and 300 each having the optical structure OS as shown in FIG. 2 and FIG. 3 can also achieve the effects and have the advantages as those of the integrated circuit 100 having the optical structure OS. Hence, no further explanation is provided hereinafter.

To sum up, in the integrated circuit having the optical structure and the manufacturing method of the integrate circuit provided in one or more embodiments of the disclosure, the manufacturing process of the optical structure and the current manufacturing process of semiconductor devices can be integrated, and the light guiding pattern layers can be formed by the metal interconnect of the semiconductor substrate, so as to directly form the optical structure on the semiconductor substrate. As such, the manufacturing method of the resultant integrated circuit is simple, cost-effective, and the resultant integrated circuit has the reduced thickness.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. An integrated circuit having an optical structure and comprising:

a semiconductor substrate; and a plurality of light guiding pattern layers located above the semiconductor substrate, wherein each of the plurality of light guiding pattern layers respectively has a plurality of openings and a plurality of side wall portions corresponding to the plurality of openings, wherein each of the plurality of side wall portions surrounds the corresponding opening, and a projection of one of the plurality of openings of one of the plurality of light guiding pattern layers on the semiconductor substrate at least partially overlaps a projection of one of the plurality of openings of adjacent one of the light guiding pattern layers on the semiconductor substrate, so as to form at least one light via hole and to allow external light to be transferred to the semiconductor substrate through the plurality of light guiding pattern layers, wherein the plurality of light guiding pattern layers comprises:

a first light guiding pattern layer, located above the semiconductor substrate and having a plurality of first openings;

a second light guiding pattern layer, located above the first light guiding pattern layer and having a plurality of second openings, the plurality of first openings respectively corresponding to the plurality of second openings, wherein a projection of each of the plurality of first openings on the semiconductor substrate and a projection of the corresponding second opening on the semiconductor substrate are overlapped on a first region; and a third light guiding pattern layer, located above the second light guiding pattern layer and having a plurality of third openings, the plurality of second openings respectively corresponding to the plurality of third openings, wherein a projection of each of the plurality of second openings on the semiconductor substrate and a projection of the corresponding third opening on the semiconductor substrate are overlapped on a second region, and at least any two of one of the first openings, one of the second openings, and one of the third openings are just partially overlapped.

2. The integrated circuit as recited in claim 1, wherein the first region and the second region are at least partially overlapped.

3. The integrated circuit as recited in claim 2, wherein the first region and the second region are completely overlapped, and one of the plurality of first openings, second openings, and third openings which are corresponding to each other forms the at least one light via hole.

4. The integrated circuit as recited in claim 2, wherein an extension direction of the at least one light via hole is perpendicular to the semiconductor substrate.

5. The integrated circuit as recited in claim 1, wherein the projection of one of the plurality of first openings on the semiconductor substrate, the first region, the projection of the corresponding second opening on the semiconductor substrate, the second region, and the projection of the corresponding third opening are sequentially arranged along an arrangement direction, and the arrangement direction is parallel to a surface of the semiconductor substrate.

6. The integrated circuit as recited in claim 5, wherein one of the plurality of first openings, second openings, and third openings which are corresponding to each other forms the at least one light via hole, an included angle is between an extension direction of a central axis of the at least one light via hole and the semiconductor substrate, and the included angle is less than 90 degrees.

7. The integrated circuit as recited in claim 1, the plurality of light guiding pattern layers being formed by a metal interconnect of the integrated circuit.

8. The integrated circuit as recited in claim 1, wherein a material of the plurality of light guiding pattern layers is metal.

* * * * *